United States Patent [19]

Ono et al.

[11] 3,861,969

[45] Jan. 21, 1975

[54] METHOD FOR MAKING III-V COMPOUND SEMICONDUCTOR DEVICES

[75] Inventors: Yuichi Ono, Kokubunji; Kazuhiro Kurata, Hachioji; Masahiko Ogirima, Tokyo; Toshimitu Shinoda, Hamura, all of Japan

[73] Assignee: Hitachi, Ltd., Tokyo, Japan

[22] Filed: Nov. 23, 1973

[21] Appl. No.: 418,212

Related U.S. Application Data

[63] Continuation-in-part of Ser. No. 129,809, March 31, 1971, abandoned.

[30] Foreign Application Priority Data

Mar. 31, 1970 Japan .............................. 45-27286

[52] U.S. Cl. .................. 148/187, 148/189, 357/17, 117/201

[51] Int. Cl. ............................................ H01l 7/44

[58] Field of Search ........... 148/187, 189; 317/235; 117/201

[56] References Cited

UNITED STATES PATENTS 3,580,745 5/1971 Kooi et al. ..................... 148/187 X 3,629,018 12/1971 Henderson et al. ................ 148/187

FOREIGN PATENTS OR APPLICATIONS 1,800,348 11/1969 Germany .......................... 317/235

*Primary Examiner*—C. Lovell
*Assistant Examiner*—J. M. Davis
*Attorney, Agent, or Firm*—Craig & Antonelli

[57] ABSTRACT

On a surface of a III-V compound semiconductor substrate an $Si_3N_4$ layer is first deposited by a chemical vapor deposition method at a temperature between 600° and 800°C with a relatively low flow rate of $SiH_4$ and $NH_3$, so as to have a growth rate of the $Si_3N_4$ layer less than about 100 A/min. Then a phosphosilicate glass layer is deposited on the $Si_3N_4$ layer also by a chemical vapor deposition method. A double layer of $Si_3N_4$ and phosphosilicate glass thus formed serves as protective layer and/or mask for the selective diffusion, whereby such double layer avoids a warping of the substrate.

4 Claims, 31 Drawing Figures

INVENTORS
YUICHI ONO, KAZUHIRO KURATA
MASAHIKO OGIRIMA, TOSHIMITU SHINODA
BY
Craig, Antonelli, Stewart & Hill
ATTORNEYS INVENTORS
YUICHI ONO, KAZUHIRO KURATA
MASAHIKO DOIKIMA, TOSHIMITU SHINODA
BY
Craig, Antonelli, Stewart & Hill
ATTORNEYS

METHOD FOR MAKING III–V COMPOUND SEMICONDUCTOR DEVICES

CROSS-REFERENCE TO RELATED APPLICATION

This is a continuation-in-part application of our prior U.S. Application, Ser. No. 129,809, filed on Mar. 31, 1971 now abandoned.

BACKGROUND OF THE INVENTION

1. Field of the Invention

This invention relates to a method for making III–V compound semiconductor devices and, more particularly, to a protection layer and a diffusion mask formed on a III–V compound semiconductor substrate comprising phosphorus.

2. Description of the Prior Art

It is often a requirement that the semiconductor substrate be coated with a substance of a glass system as a mask for the protection or the selective diffusion. An $SiO_2$ layer has hitherto been widely used for the protective coating on the III–V compound semiconductors. For example, for the purpose of selectively diffusing zinc into a GaAs semi-conductor crystal wafer by means of an $SiO_2$ layer, the thickness of $SiO_2$ layer must be 1 to 2 $\mu$. If the $SiO_2$ layer is thicker than 7,000 – 8,000 A, there is the danger of cracking the layer due to the difference in the thermal expansion coefficient between GaAs and $SiO_2$ and to the intrinsic stress in the $SiO_2$ layer. It is known that diffusion of Ga into $SiO_2$ takes place in the boundary between the $SiO_2$ and the GaAs, thereby introducing undesirable characteristics into the semiconductor surface. When the semiconductor crystal to be coated comprises phosphorus such as GaP, $GaAs_{1-x}P_x$, $In_{1-x}Ga_xP$ and the like, $SiO_2$ reacts with the phosphorus contents in the semiconductor crystal to ruin the $SiO_2$ layer.

To solve the foregoing problems, a method of depositing a phosphosilicate glass layer of a $P_2O_5.SiO_2$ system on the semiconductor substrate has been proposed. According to this method, the phosphosilicate glass layer is formed to a thickness of about 8,000 A which is sufficient for the purpose of the mask against zinc diffusion, thus markedly reducing the possibility of cracking the layer. Still the cracking possibility cannot totally be eliminated.

The phosphosilicate glass layer serves to detract from the surface characteristics of the semiconductor, as in the $SiO_2$ layer. Furthermore, the same problems as in the $SiO_2$ layer are unavoidable when the semiconductor crystal to be coated contains phosphorus. In other words, the phosphosilicate glass layer is usable on GaAs, but is not desirable for use on a semiconductor with phosphorus contents.

Another method proposed for improving the prior art uses an $Si_3N_4$ layer deposited on the substrate. This method is fairly effective in removing the foregoing drawbacks. However, for example, when an $Si_3N_4$ layer is formed on the whole surface of a $GaAs_{0.6}P_{0.4}$ crystal by chemical vapor deposition method, a warping of the semiconductor structure is brought about due to temperature change. Namely, the warp comes out when the heat applied to the substrate is removed after depositing an $Si_3N_4$ layer on the III–V compound semiconductor. This is because the $Si_3N_4$ and the III–V compound semiconductor have different thermal expansion coefficients; namely, $3.85 \times 10^{-6}{}^\circ C^{-1}$ ($Si_3N_4$) and $5 \sim 7 \times 10^{-6}{}^\circ C^{-1}$ (III–V compound semiconductor) and because an $Si_3N_4$ layer deposited by a chemical vapor deposition method has a compressive or tensile intrinsic stress depending upon deposition conditions. Generally the $Si_3N_4$ layer tends to possess an excess of electrons and, as a result, the holes in the crystal substrate are concentrated on the surface of the semiconductor substrate. This often serves to invert the n-type crystal surface into p-type, thus forming a p-type inversion layer.

SUMMARY OF THE INVENTION

The present invention is intended for the purpose of removing all the foregoing drawbacks of the prior art by providing a novel method for depositing a protection layer or a mask on the surface of a III–V compound semiconductor substrate or on the surface of a mixed crystal of III–V compounds, and the invention is characterized in that the method comprises the steps of depositing an $Si_3N_4$ layer on the surface thereof at a temperature between 600° and 800°C with a relatively low flow rate of $SiH_4$ and $NH_3$ so as to have a growth rate of the $Si_3N_4$ layer less than about 100 A/min. and of depositing a phosphosilicate glass layer on the $Si_3N_4$ layer.

By forming layers of $Si_3N_4$ and phosphosilicate glass in the above manner, the invention makes it possible to realize a semiconductor device in which the stress distortion caused between the layer and the semiconductor substrate is reduced, the zinc diffusion mask effect is increased, the p-n junction on the crystal surface is well protected against the atmosphere, and thus the junction characteristic is improved and the operation of the device is stabilized.

These and other objects, features and advantages of the invention will be illustrated by the following non-limitative examples taken in conjunction with the accompanying drawings.

FIGS. **4*a* through 4*h*** illustrate the steps for producing a semiconductor device of this invention.

Figure 5:
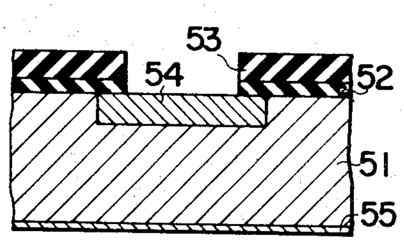

FIG. 5 is a cross-sectional view showing part of a semiconductor device of this invention.

FIGS. **6*a* through 6*m*** show the steps for producing another semiconductor device of this invention.

FIG. **7*a* shows a plan view of a semiconductor device formed according to the steps shown in FIGS. 6*a* – 6*m***.

Figure 7A:
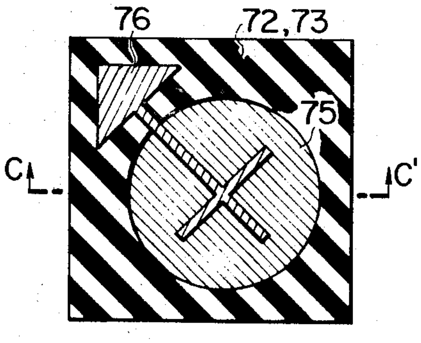

FIG. **7*b* is a cross-sectional view taken along line C–C' in FIG. 7*a***.

Figure 8:
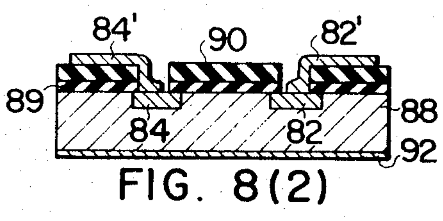

FIG. 8(1) is a plan view showing another semiconductor device embodying this invention.

FIG. 8(2) is a cross-sectional view taken along line A–A' in FIG. 8(1).

FIG. 8(3) is a cross-sectional view taken along line B–B' in FIG. 8(2), and FIG. 8(4) is a partial view, on an enlarged scale, showing the structure X in FIG. 8 (1).

DESCRIPTION OF PREFERRED EMBODIMENTS

Example 1

Figure 1:
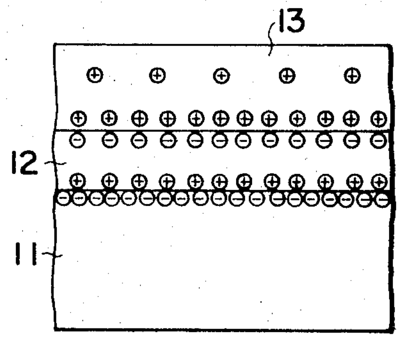
FIG. 1 is a diagram showing the state of electric charge distribution in a three-layer semiconductor element of this invention.

Referring now to FIG. 1, there is shown the state of charge distribution in a three-layer structure comprising phosphosilicate glass $Si_3N_4$-$GaAs_{1-x}P_x$. In FIG. 1, reference numeral 11 denotes an n-type $GaAs_{1-x}P_x$ substrate, reference numeral 12 an $Si_3N_4$ layer, and reference numeral 13 a diffusion mask of a phosphosilicate glass layer.

As shown in FIG. 1, the effect of the double mask used for the diffusion of an impurity such as zinc is equal to the total effect of the phosphosilicate glass layer and of the $Si_3N_4$ layer used in the conventional manner. The double mask makes available other advantages as will appear more fully hereinafter.

The phosphosilicate glass layer tends to possess an excess of positive ions. Some $Na^+$ ions originate from impurities contained originally in the raw material of silicon. Some come from a small quantity of impurities during its formation, also. The layer contains, in addition, a small quantity of water which produces H+ and silanol (Si-OH) by a reaction with silicon. Since $Si_3N_4$ layer ordinarily contains an excess of electrons, a double layer consisting of silicon nitride and phosphosilicate glass may be made electrically neutral. The state of electric charge distributuon in the three-layer semiconductor element is shown in FIG. 1, in which⊕ represents positive charge and ⊖ represents negative charge.

Figure 2:
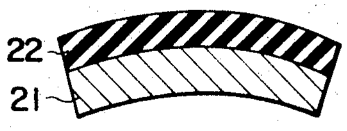
FIG. 2 PRIOR ART
FIG. 2 is a cross-sectional view showing a conventional semiconductor element having its silicon substrate coated with an $SiO_2$ film by the thermal oxidation method.
Figure 3:
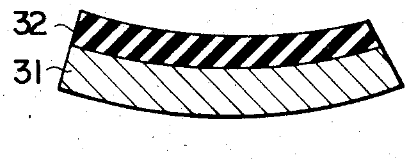
FIG. 3 PRIOR ART
FIG. 3 is a cross-sectional view showing another conventional semiconductor element having its substrate coated with an $SiO_2$ film by the chemical vapor deposition method.

The phosphosilicate glass layer deposited on the $Si_3N_4$ layer by chemical vapor deposition method has a nature of modifying the foregoing warp of the semiconductor substrate caused by the $Si_3N_4$ layer formed independently. The thermal expansion coefficient of $SiO_2$ itself is very small. For example, a warp as shown in FIG. 2 is brought about when an $SiO_2$ layer is formed on the surface of a silicon crystal by thermal oxidation technique, and the heat applied is reduced to room temperature. Reference numeral 21 in FIG. 2 denotes a silicon crystal substrate, and reference numeral 22 an $SiO_2$ layer formed on the substrate 21. When this $SiO_2$ layer is formed by chemical vapor deposition method, the direction of the crystal warp is the reverse as shown in FIG. 3 compared to that shown in FIG. 2 due to its intrinsic tensile stress. Reference numeral 31 denotes a silicon crystal substrate, and reference numeral 32 an $SiO_2$ layer formed by chemical vapor deposition method. This $SiO_2$ layer behaves as if its thermal expansion coefficient is large. The $SiO_2$ layer formed on the $GaAs_{1-x}P_x$ substrate by chemical vapor deposition method behaves also as if its thermal expansion coefficient is large. That is, the direction of the warp is that shown in FIG. 3. Therefore, by suitably combining the $Si_3N_4$ layer with the $SiO_2$ layer, the warps of the two layers can be offset against each other.

Figure 4A:
Figure 4B:
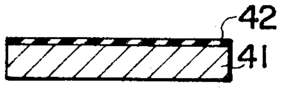

A diode emitting visible light of 6,500 A is made by using a $GaAs_{0.6}P_{0.4}$ mixed crystal and electrodes are formed directly on the light-emitting surface (p-type layer) by wire bonding technique. The production process of a light-emitting element of this invention is illustrated in FIGS. 4*a* through 4*h*. First, a 300 $\mu$ thick $GaAs_{0.6}P_{0.4}$ substrate 41 as shown in FIG. 4*a* is prepared. This substrate is a good crystal, formed by conventional vapor epitaxial growth technique, and has a carrier density of $10^{16}cm^{-3}\sim10^{18}cm^{-3}$ and a mobility of 2,000 $cm^2/V.sec\sim3,000\ cm^2/V.sec$.

Figure 4C:
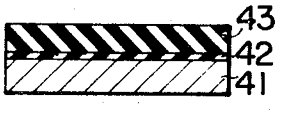
Figure 4D:
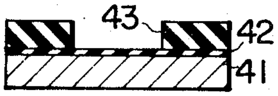
Figure 4E:
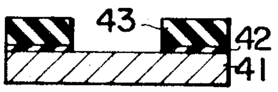
Figure 4F:
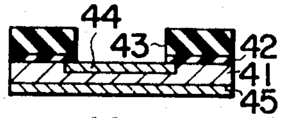

For the surface treatment, the substrate is subjected to ultra-sonic washing using trichloroethylene and alcohol, pure water washing and drying by spinner. Then, the crystal substrate is placed into a chemical vapor deposition device, into which $N_2$ gas is supplied as the carrier gas at a flow of 15 l/min, and at the same time, $NH_3$ gas and $SiH_4$ gas are supplied as the reaction gases at a flow of 200 cc/min and 4 cc/min, respectively. The substrate is heated up to a temperature of 600°~800°C. As a result thereof, an $Si_3N_4$ layer 42 of 1,000~3,000 A is deposited on the substrate 41 as shown in FIG. 4f according to the reaction formula $3SiH_4+4NH_3 \xrightarrow{600\ \sim\ 800°\ C} Si_3N_4\downarrow+12H_2$, where ↓ denotes a deposition.

The growth rate of the $Si_3N_4$ must be between about 10 and about 100 A/min. Below about 10 A/min the chemical vapor deposition process requires too long a period of time to be used in an industrial process. For the growth rates faster than about 100 A/min, an $Si_3N_4$ layer obtained by chemical vapor deposition method has an intrinsic tensile stress, as discussed (for chemical vapor deposited $Si_3N_4$ films on silicon) by Masao Tamura et al in their article published in the Japanese Journal of Applied Physics, Vol. 11, No. 8, pp. 1097 ~ 1105. Therefore, in order that the $Si_3N_4$ layer can compensate the aforementioned warping of an $SiO_2$ layer formed on a III–V compound semiconductor substrate by chemical vapor deposition method, its growth rate must be maintained at a sufficiently low value.

After this process, a phosphosilicate glass layer 43 (composition: $P_2O_5/SiO_2$ in atomic ratio ≈ 0.01~0.1) is deposited to a thickness of 2,000~6,000 A on the $Si_3N_4$ layer as shown in FIG. 4*c* under the condition that $PH_3$ gas is supplied thereto at a flow of 0.7~7 cc/min, $SiH_4$ gas at 35 cc/min, $O_2$ gas at 300 cc/min, $N_2$ gas at 5 l/min, and the substrate is heated to 400°C.

The phosphosilicate glass layer thus formed has an intrinisic tensile stress, as discussed by Hideo Sunami et al. in their article published in the Journal of Applied Physics, Vol. 41, No. 13, pp. 5,115 - 5,117.

A photo-resist such as KPR and KTFR is applied to the surface of the sample to a thickness of 7,000 A and exposed to ultra-violet rays. Then, the sample surface is developed by the use of a photoresist developer. Part of the phosphosilicate glass layer corresponding to the etching pattern determined by the photo-resist is etched by an oxide film etching solution comprising $NH_4F$ and HF at the ratio, $NH_4F$ : HF=6:1, as shown in FIG. 4*d*. In this process, the $Si_3N_4$ layer 42 beneath the phosphosilicate glass layer is not etched by the etching solution. Then, the sample is dipped into a phosphoric acid solution held at a temperature of 180°C, thereby etching the $Si_3N_4$ layer with the phosphosilicate glass layer as a mask as shown in FIG. 4*e*. The phosphosilicate glass layer is not etched by phosphoric acid.

Figure 4G:
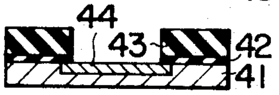
Figure 4H:
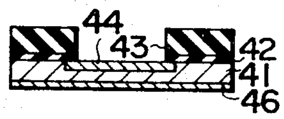

Then zinc is diffused into the substrate through the phosphosilicate glass -$Si_3N_4$ double layer. In this process, the known diffusion method using $ZnAs_2$, a Ga-As-Zn or a Ga-P-Zn system is applied. The depth of the diffusion is 1.5~3$\mu$ in case of a $GaAs_{0.6}P_{0.4}$ crystal. More specifically, for example, the typical diffusion condition using a Ga-P-Zn system is that 3.2 mg of Ga, 4.7 mg of P, 10.0 mg of GaP and 6.8 mg of Zn are used for the diffusion source, the diffusion temperature is about 700°~900°C, and the diffusion time is about 0.1∼1 hour. Reference numeral 44 indicates this Zn diffusion layer. In this process, the back surface of the substrate is exposed to the diffusion atmosphere. Therefore a Zn diffusion layer 45 is formed to the same depth as in the top surface thereof, as shown in FIG. 4*f*. The back surface is lapped with No. 4000 carborundum, to remove the diffusion layer 45 as shown in FIG. 4*g*. A metal 46 such as an Au-Ge eutectic alloy, Sn, an Au-Sn eutectic alloy, an Au-Si eutectic alloy or an Ni-Au-Ge eutectic alloy which forms an ohmic contact with the n-type semiconductor is bonded to the back surface of the substrate by conventional electroless plating technique as in FIG. 4*h*.

The p-n junction light emitting diode alloy formed in the foregoing manner is scribed and equipped with a stem. When a forward voltage is applied to the diode, an emission of about 6,500 A visible light is obtained from the exposed surface of the base crystal of the sample using $GaAs_{0.6}P_{0.4}$. FIG. 5 is a cross-sectional view showing the structure of a p-n junction diode fabricated in the foregoing manner. In FIG. 5, the reference numeral 51 denotes an n-type $GaAs_{1-x}P_x$ substrate, reference numeral 52 an $Si_3N_4$ layer, reference numeral 53 a phosphosilicate glass layer, reference numeral 54 a p-type diffusion layer into which zinc is diffused, and reference numeral 55 a back surface electrode comprising an Au-Ge eutectic alloy, Sn or the like.

Example 2

Figure 6A:
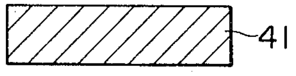
Figure 6H:
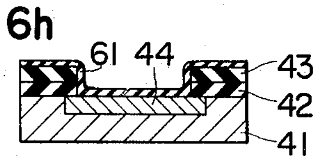
Figure 6B:
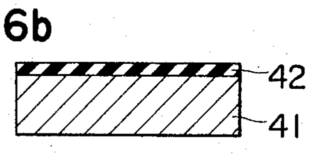
Figure 6I:
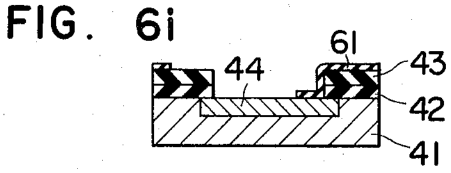
Figure 6C:
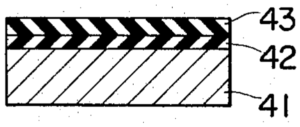
Figure 6J:
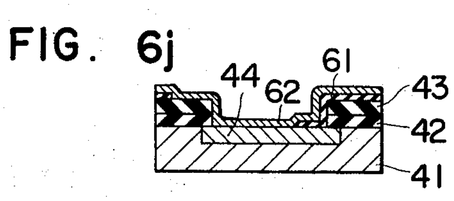
Figure 6D:
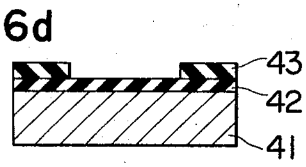

FIGS. 6*a* through 6*m* illustrate the process steps for forming a positive side electrode by evaporation technique and for providing a bonding area other than on the light emission surface. The steps shown in FIGS. 6*a* through 6*g* are the same as those shown in FIGS. 4*a* through 4*g*. After polishing the base surface of the substrate, an $SiO_2$ layer is formed to a thickness of 3,000 A on the base thereof by the known technique, as shown in FIG. 6*h*. Then, the $SiO_2$ layer is photo-etched to correspond to the pattern of the electrode, as shown in FIG. 6*i*. Reference numeral 61 shown in FIGS. 6*h* through 6*k* indicates this $SiO_2$ layer. Gold is deposited to a thickness of about 3,000 A on the $SiO_2$ layer by conventional evaporation technique applying base heating at 500°C, as in FIG. 6*j*. This Au layer is indicated by reference numeral 62 in FIGS. 6*j* through 6*m*. Instead of Au, Al may be used for the evaporated layer. If Al is used, the base heating is done at 300°C.

Figure 6K:
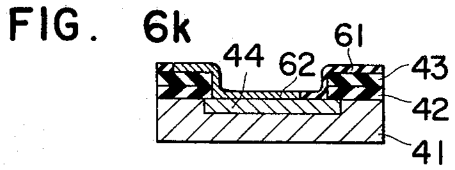
Figure 6E:
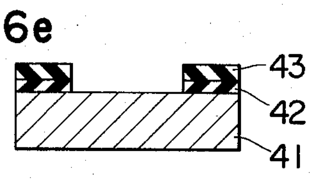
Figure 6L:
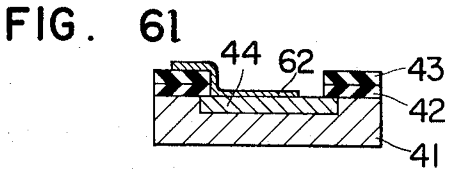
Figure 6F:
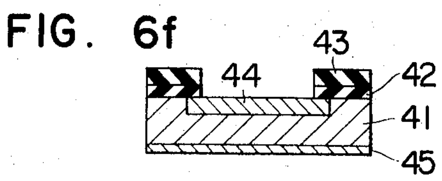
Figure 6M:
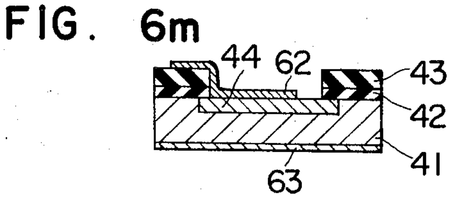
Figure 6G:
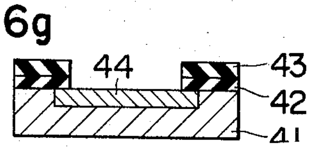
Figure 7B:
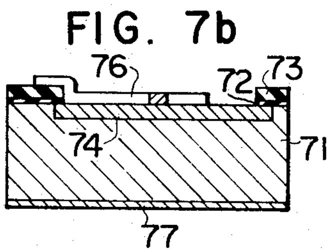
Figure 8:
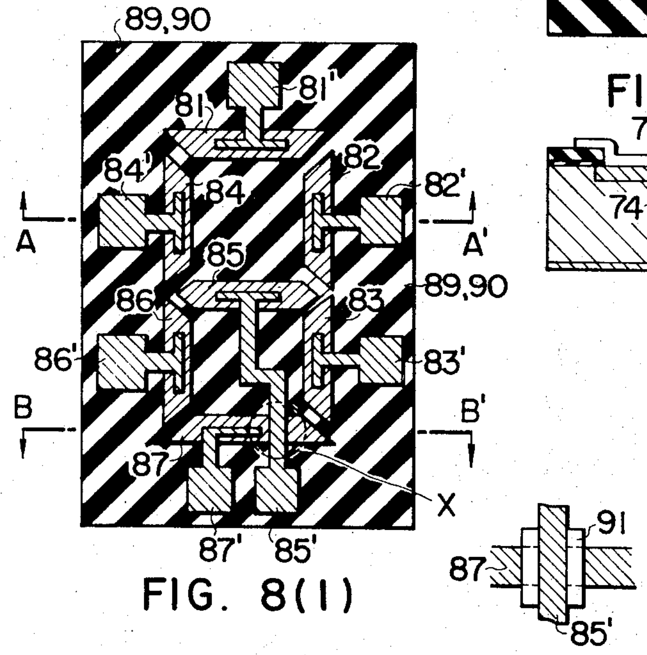
Figure 8:
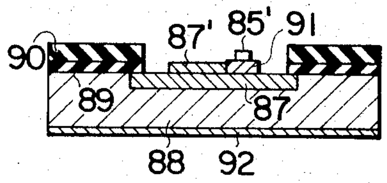

As shown in FIG. 6*k*, the Au layer, excepting for the necessary area, is removed by conventional photoresist process using a solution prepared from 2 g of $NH_4I$ and 0.3 g of $I_2$ dissolved in a solvent comprising $C_2H_5OH$ and $H_2O$ at the ratio of 15 to 10. Then, a solution comprising $NH_4F$ and HF at the ratio of 6 to 1 is used to remove the $SiO_2$ layer 61 by etching, as in FIG. 6*l*. One of the electrode materials, such as Au-Ge, Sn, Au-Sn, Au-Si and Ni-Au-Ge is bonded to the back surface by evaporation technique, as in FIG. 6*m*. Then, the sample is scribed into a plurality of separate diodes. The back surface electrode is indicated by reference numeral 63. FIGS. 7*a* and 7*b* show in plan and in sectional view, respectively, the structure of a light-emitting diode fabricated in the above manner. In FIGS. 7*a* and 7*b*, reference numeral 71 denotes an n-type $GaAs_{0.6}P_{0.4}$ mixed crystal substrate, reference numeral 72 an $Si_3N_4$ layer, reference numeral 73 a phosphosilicate glass layer, reference numeral 74 a p-type layer into which zinc is diffused, reference numeral 75 a window for the selective diffusion, reference numeral 76 an electrode of Al or Au, and reference numeral 77 a back surface electrode of Sn or Au-Ge.

Example 3

Applying the steps of production as illustrated in Example 2, it is possible to fabricate a photo display element having a plurality of segments. FIGS. 8(1) through 8 (4) show in plan and sectional views the structure of a photo display device comprising seven segments formed according to this invention.

FIG. 8(1) is a plan view wherein segments 81, 82, 83, 84, 85, 86 and 87 are p-type layers formed on an n-type $GaAs_{0.6}P_{0.4}$ substrate 88 by selective diffusion technique. These layers are electrically isolated from each other. FIGS. 8(2) and 8 (3) are sectional views taken along lines A–A′ and B–B′ of FIG. 8(1), respectively, wherein reference numeral 89 denotes an $Si_3N_4$ layer, and reference numeral 90 a phosphosilicate glass layer. The reference numerals 81′, 82′, 83′, 84′, 85′, 86′ and 87′ represent gold or aluminum vapor deposition layers serving as electrodes for the segments 81 through 87 respectively. The electrode 85′ of the central segment 85 is led out by way of an $SiO_2$ layer 91 by a conventional cross-over method as shown in FIG. 8(4), or through the intermediate region between segments. The back surface electrode of Au-Ge is indicated by reference numeral 92.

In summary, though $Si_3N_4$ is widely in use for the protection layer or mask on a GaAsP crystal substrate, its thermal expansion coefficient is smaller than that of GaAsP and it can have an intrinsic compressive stress, hence, the substrate crystal becomes warped when the heat applied to the substrate is removed after coating the protection film or mask. Although the thermal expansion coefficient of phosphosilicate glass itself is smaller than that of GaAsP, the phosphosilicate glass when formed on the substrate by a chemical vapor deposition method, behaves as if its thermal expansion coefficient is larger than that of GaAsP due to its intrinsic tensile stress. Hence, when a double layer consisting of an $Si_3N_4$ layer and of a phosphosilicate glass layer is deposited to a suitable thickness as a protection layer or as a mask on the GaAsP crystal substrate, it is possible to avoid the warping of the substrate. This double layer, when deposited as a protection layer or as a mask on an n-type semiconductor substrate, is advantageous also as regards the electric charge distribution.

While we have shown and described several embodiments in accordance with the present invention, it is understood that the latter is not limited thereto, but is susceptible of numerous changes and modifications as known to those skilled in the art, and we therefore do not wish to be limited to the details shown and described herein for illustrative purposes only but intend to cover all such changes and modifications as are encompassed by the scope of the appended claims.

What we claim:

1. A method for making III–V compound semiconductor devices comprising the steps of:

a. preparing a semiconductor substrate made of a III–V compound of first conductivity type;

b. depositing an $Si_3N_4$ layer, which is about 1,000 to 3,000 A thick, by a chemical vapor deposition method at a temperature comprised between 600° and 800°C with a sufficiently low flow rate of $SiH_4$ and $NH_3$ so as to give a growth rate of the $Si_3N_3$ layer comprised between about 10 A/min and 100 A/min, at least partly on a surface of said substrate;

c. depositing a phosphosilicate glass layer, which is about 2,000 to about 6,000 A thick and in which the atomic percent ratio of $P_2O_5$ to $SiO_2$ is about 1 to about 10%, on said $Si_3N_4$ layer, covering substantially the whole outer surface of said $Si_3N_4$ layer;

d. removing at least a part of the double layer consisting of said $Si_3N_4$ layer and said phosphosilicate glass layer by photoetching to thereby form a window for selective diffusion;

e. diffusing second conductivity type impurity atoms through said window into said substrate by using said double layer as a diffusion mask, thereby forming a diffusion layer;

f. depositing a metal layer on at least a part of the surface of said diffusion layer within said window, thereby forming an electrode; and g. depositing a metal layer on the other side of said substrate, thereby forming another electrode.

2. A method for making a III–V compound semiconductor device according to claim 1, which said semiconductor substrate is of n-type and said diffused impurity atoms are of p-type.

3. A method for making a III–V compound semiconductor device according to claim 2, wherein said substrate is made of a mixed crystal of III–V compounds.

4. A method for making a III–V compound semiconductor device according to claim 3, wherein said substrate comprises P as a constituent element.

* * * * *